(12) United States Patent
Yu et al.

(10) Patent No.: US 7,095,065 B2
(45) Date of Patent: Aug. 22, 2006

(54) VARYING CARRIER MOBILITY IN SEMICONDUCTOR DEVICES TO ACHIEVE OVERALL DESIGN GOALS

(75) Inventors: Bin Yu, Cupertino, CA (US); Shibly S. Ahmed, San Jose, CA (US); Haihong Wang, Milpitas, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 141 days.

(21) Appl. No.: 10/633,504

(22) Filed: Aug. 5, 2003

(65) Prior Publication Data

US 2005/0029603 A1 Feb. 10, 2005

(51) Int. Cl.
*H01L 29/80* (2006.01)

(52) U.S. Cl. .............. 257/274; 257/351; 257/357; 257/369

(58) Field of Classification Search ............ 257/274, 257/351, 357, 369
See application file for complete search history.

(56) References Cited

U.S. PATENT DOCUMENTS

| | | | |
|---|---|---|---|
| 5,391,506 A | 2/1995 | Tada et al. ............... | 437/41 |
| 2002/0011612 A1 | 1/2002 | Hieda ...................... | 257/262 |
| 2003/0102497 A1 | 6/2003 | Fried et al. .............. | 257/255 |
| 2004/0110331 A1 | 6/2004 | Yeo et al. ................ | 438/199 |

OTHER PUBLICATIONS

Digh Hisamoto et al.: "FinFET—A Self-Aligned Double-Gate MOSFET Scalable to 20 nm," IEEE Transactions on Electron Devices, vol. 47, No. 12, Dec. 2000, pp. 2320–2325.

Yang–Kyu Choi et al.: "Sub–20nm CMOS Fin FET Technologies," 0–7803–5410–Sep. 1999 IEEE, Mar. 2001, 4 pages.

Xuejue Huang et al.: "Sub–50 nm P–Channel Fin FET," IEEE Transactions on Electron Devices, vol. 48, No. 5, May 2001, pp. 880–886.

Yang–Kyu Choi et al.: "Nanoscale CMOS Spacer FinFET for the Terabit Era," IEEE Electron Device Letters vol. 23, No. 1, Jan. 2002, pp. 25–27.

Xuejue Huang et al.: "Sub 50–nm FinFET: PMOS," 0–7803–7050–Mar. 2001 IEEE, Sep. 1999 4 pages.

F. Daugé et al., "Channels Separation in FINFETs", ULIS'2003 Workshop, Udine, Mar. 20–21 2003, 20 pages, XP002321769.

N.H.E. Weste et al., "Principles of CMOS VLSI Design", Addison–Wesley, XP002321770, pp. 140–141, 1988.

J. Park et al., "Pi–Gate SOI MOSFET", IEEE Electron Device Letters, vol. 22, No. 8, Aug. 2001, pp. 405–406, XP001099966.

M. Lemme et al., "Influence of Channel width on n–and p–type nano–wire–MOSFETs on silicon on insulator substrate", Microelectronic Engineering, vol. 67–68, Jun. 2003, pp. 810–817, XP004428954.

*Primary Examiner*—Fetsum Abraham
(74) *Attorney, Agent, or Firm*—Harrity Snyder LLP

(57) ABSTRACT

A semiconductor device may include a substrate and an insulating layer formed on the substrate. A first device may be formed on the insulating layer, including a first fin. The first fin may be formed on the insulating layer and may have a first fin aspect ratio. A second device may be formed on the insulating layer, including a second fin. The second fin may be formed on the insulating layer and may have a second fin aspect ratio different from the first fin aspect ratio.

20 Claims, 10 Drawing Sheets

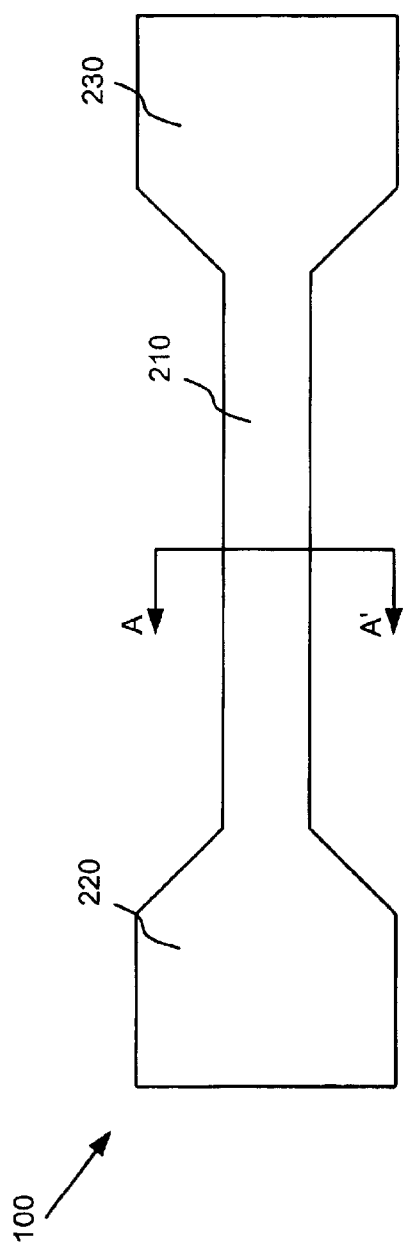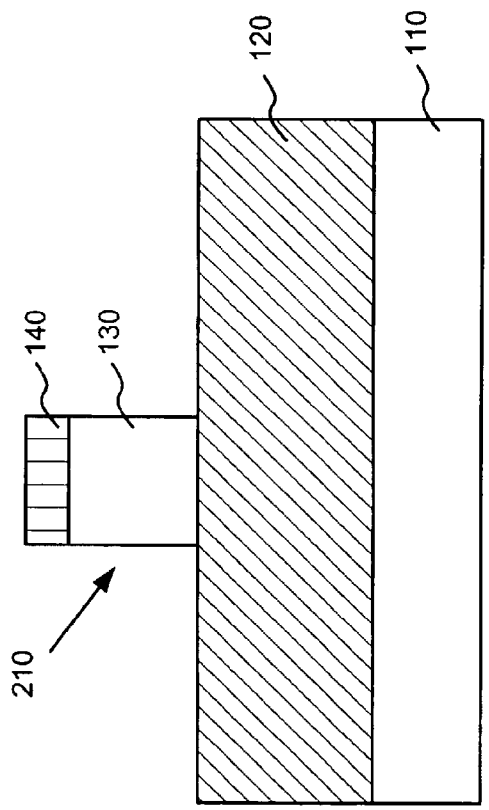

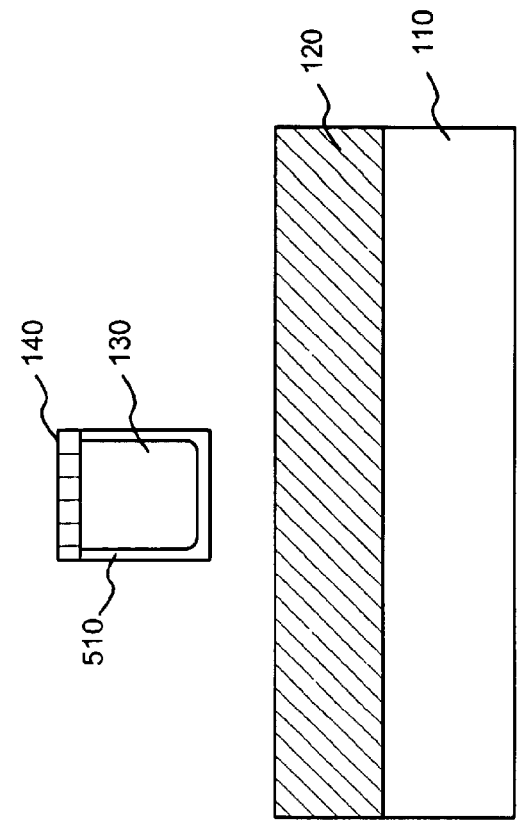
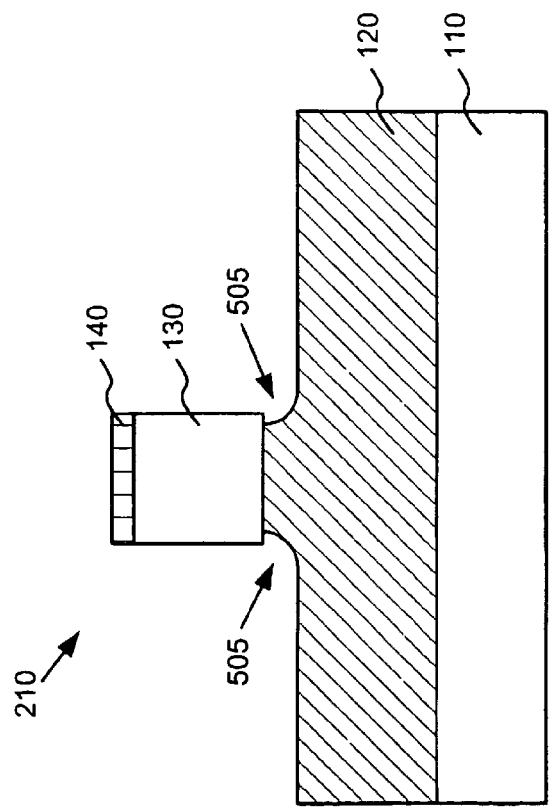

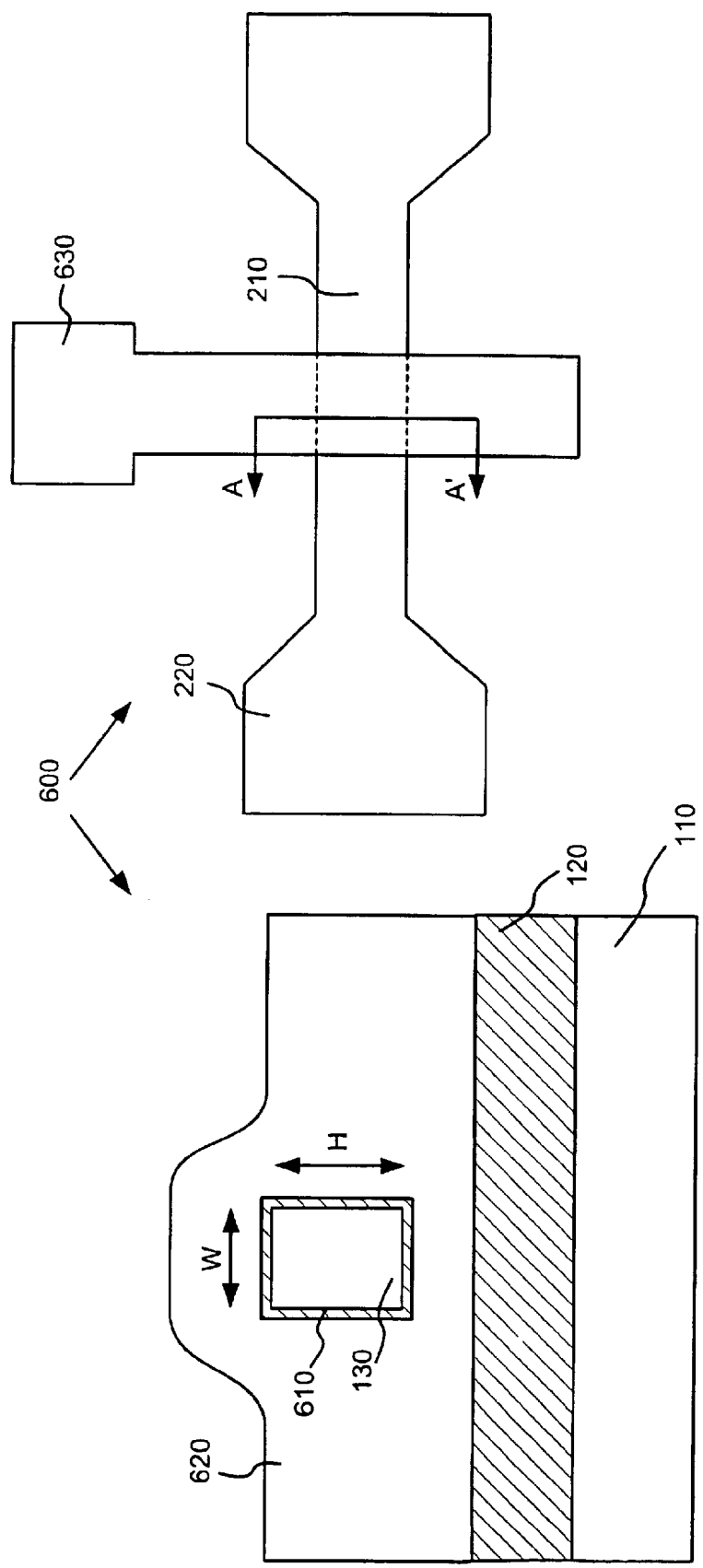

VARYING CARRIER MOBILITY IN SEMICONDUCTOR DEVICES TO ACHIEVE OVERALL DESIGN GOALS

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on two sides of the channel, rather than on only one side as in conventional MOSFETs. When there are two gates, the electric field generated by the drain is better screened from the source end of the channel. Also, two gates can control more current than a single gate, resulting in a stronger switching signal.

A FinFET is a recent MOSFET structure that exhibits good short channel behavior. A FinFET may include a vertical channel formed in a vertical fin. The FinFET structure may be fabricated using layout and process techniques similar to those used for conventional planar MOSFETs.

DISCLOSURE OF THE INVENTION

Implementations consistent with the present invention may provide a first FinFET device with a first fin aspect ratio and a second FinFET device with a second fin aspect ratio.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a semiconductor device including a substrate and an insulating layer formed on the substrate. A first device may be formed on the insulating layer, including a first fin. The first fin may be formed on the insulating layer and may have a first fin aspect ratio. A second device may be formed on the insulating layer, including a second fin. The second fin may be formed on the insulating layer and may have a second fin aspect ratio different from the first fin aspect ratio.

According to another aspect of the invention, a semiconductor device may include an insulating layer and a first device formed on the insulating layer. The first device may include a first fin formed on the insulating layer and having a first height and a first width. The first device also may include a first dielectric layer formed on at least three sides of the first fin and a first gate adjacent the first dielectric layer. A second device may be formed on the insulating layer. The second device may include a second fin formed on the insulating layer and having a second height and a second width. The second device also may include a second dielectric layer formed on at least three sides of the second fin and a second gate adjacent the second dielectric layer. A first ratio of the first height and first width may be different from a second ratio of the second height and second width.

According to a further aspect of the invention, a semiconductor device may include an insulating layer and an N-type device formed on the insulating layer. The N-type device may include a first fin formed on the insulating layer and having a first height and a first width. A P-type device may be formed on the insulating layer. The P-type device may include a second fin formed on the insulating layer and having a second height and a second width. The second width may be a predetermined multiple of the first width. The first height and the second height may be configured so that a carrier mobility of the N-type device approximately equals a carrier mobility of the P-type device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

FIG. 2A schematically illustrates the top view of a fin structure in accordance with an exemplary embodiment of the present invention.

FIG. 2B is a cross-section illustrating the formation of the fin structure of FIG. 2A in accordance with an exemplary embodiment of the present invention.

FIGS. 5A to 5D are cross-sectional and top views illustrating the formation of a u-gate FinFET from the device of FIG. 2B in accordance with an exemplary embodiment of the present invention.

FIGS. 6A and 6B are cross-sectional and top views illustrating the formation of a round-gate FinFET from the device of FIG. 2B in accordance with an exemplary embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide different FinFET devices with different fin aspect ratios. These different fin aspect ratios may be used to adjust overall carrier mobilities of the FinFET devices.

Figure 1:
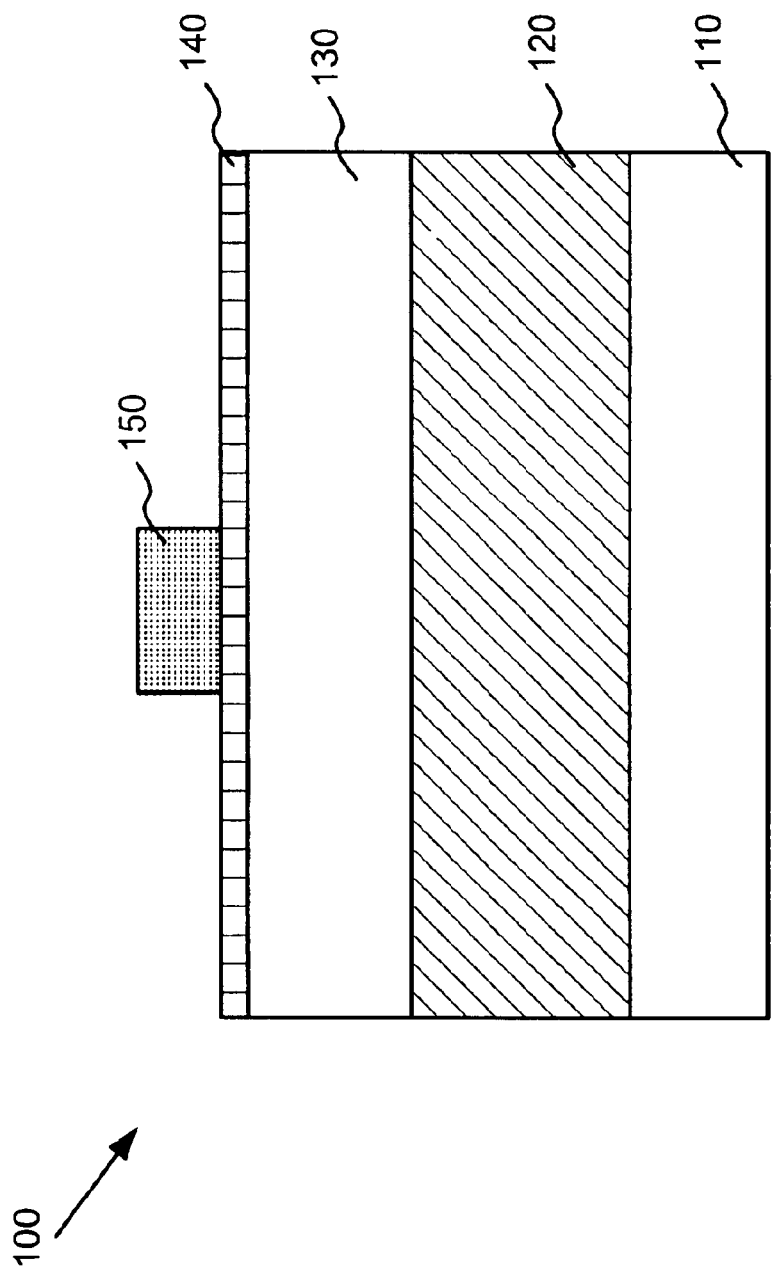
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Although FIG. 1 and subsequent figures illustrate a single device 100, those skilled in the semiconductor arts will understand that other devices (e.g., semiconductor devices 710, 720, etc. (see FIG. 7)) may be formed on the same wafer (or portion of a wafer, chip, etc.) in parallel with semiconductor device 100 using the process described herein. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A top dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be formed to a thickness ranging from about 150 Å to about 700 Å. Next, a photoresist material may be deposited and patterned to form a photoresist mask 150 for subsequent processing. The photoresist material may be deposited and patterned in any conventional manner.

Semiconductor device 100 may then be etched. In an exemplary implementation, dielectric layer 140 and silicon layer 130 may be etched in a conventional manner, with the etching terminating on buried oxide layer 120 to form a fin. Photoresist mask 150 may then be removed. After the formation of the fin, source and drain regions may be formed (e.g., by deposition or epitaxial growth of a semiconducting material) adjacent the respective ends of the fin. For example, in an exemplary embodiment, a layer of silicon, germanium or combination of silicon and germanium may be deposited, patterned and etched in a conventional manner to form source and drain regions. Alternately, the source and drain regions may be formed in the same photolithography process that forms the fin.

FIG. 2A schematically illustrates the top view of a fin structure 210 on semiconductor 100 formed in such a manner. Source region 220 and drain region 230 may be formed adjacent the ends of fin structure 210 on buried oxide layer 120, according to an exemplary embodiment of the present invention.

FIG. 2B is a cross-section along line A–A' in FIG. 2A illustrating the formation of fin structure 210 in accordance with an exemplary embodiment of the present invention. As described above, dielectric layer 140 and silicon layer 130 may be etched to form structure 210. Structure 210 may include a silicon fin 130 and a dielectric cap 140. In an exemplary implementation, the width of silicon fin 130 may range from about 10 Å to about 100 Å.

The source/drain regions 220 and 230 may be doped at this point or at a later processing stage (e.g., after formation of a gate). For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. Activation annealing may then be performed to activate the source/drain regions 220 and 230.

Various differently-structured FinFET devices may be formed from device 100 illustrated in FIGS. 2A and 2B. Such different FinFET devices may include: 1) a double-gate FinFET, 2) a π-gate FinFET, 3) a u-gate FinFET, and/or 4) a round-gate FinFET. These four exemplary types of FinFET devices will be described in further detail below in conjunction with the principles of the invention.

Double Gate FinFET

Figures 3A, 3B:
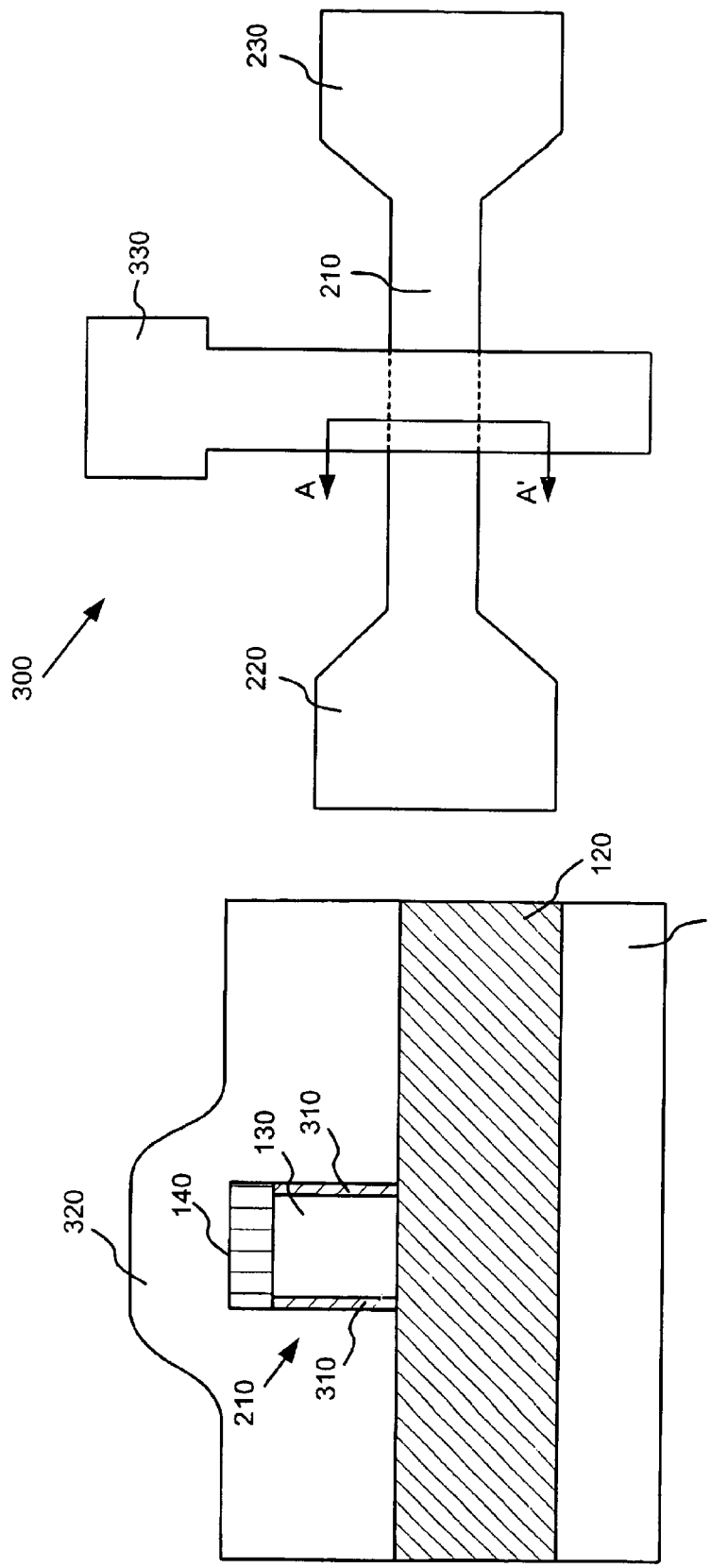
FIGS. 3A and 3B are cross-sectional and top views illustrating the formation of a double-gate FinFET from the device of FIG. 2B in accordance with an exemplary embodiment of the present invention.

FIG. 3A is a cross-section illustrating the formation of a double-gate FinFET 300 from structure 210 in FIGS. 2A and 2B in accordance with an exemplary implementation. A relatively thin gate oxide 310 may be formed on exposed side surfaces of fin 130 as illustrated in FIG. 3A. For example, gate oxide 310 may be thermally grown on fin 130. Gate oxide 310 may be grown to a thickness of about 50 Å to about 150 Å on the side surfaces of fin 130.

A gate material layer 320 may be deposited over fin structure 210 after formation of gate oxide 310. In an exemplary implementation, gate material layer 320 may include polysilicon deposited using conventional chemical vapor deposition (CVD) or other well known techniques. Alternatively, other semiconducting materials, such as germanium or combinations of silicon and germanium, or various metals may be used as the gate material in layer 320.

As illustrated in the top view of FIG. 3B, a gate may be patterned and etched in gate material layer 320 to form gate structure 330 that extends across a channel region of the fin structure 210. The resulting device 300 may be referred to broadly as a "double-gate FinFET."

Gate structure 330 may be defined in gate material layer 320 by lithography (e.g., photolithography). Although not shown in FIGS. 3A and 3B, gate material layer 320 may be planarized and a bottom antireflective coating (BARC) layer and possibly a top antireflective (TAR) coating (not shown) may be deposited on planarized gate material layer 320 to facilitate etching of gate material layer 320. As will be understood by those skilled in the semiconductor art, a planarized gate material layer 320 and the BARC layer may facilitate patterning an overlying photoresist layer more precisely. As a result, gate structure 330's critical dimension (CD) (i.e., its smallest feature size, such as the gate width) may be formed with dimensions as small as from about 20 nm to about 50 nm.

Gate structure 330 may include a gate portion proximate to the sides of the fin structure 210 and a larger electrode portion spaced apart from the fin structure 210. The electrode portion of gate structure 330 may provide an accessible electrical contact for biasing or otherwise controlling the gate portion.

Returning to FIG. 3A (along line A–A' in FIG. 3B), the channels in fin 130 in double-gate FinFET 300 may exist along the two side walls of fin 130 adjacent gate oxide 310. The relatively thick dielectric cap 140 above the top surface of fin 130 may prevent channel formation in the top surface of fin 130. The two channels along side walls of fin 130 give rise to the name "double-gate" in double-gate FinFET 300, because gate material 320 adjacent the two side walls of fin 130 constitutes two gates (i.e., a "double-gate") controlling the two channels along the side walls of fin 130.

The two side walls of fin 130 may have a common crystalline orientation (e.g., orientation <110>). Because of this common, vertical, crystalline orientation of the side walls of fin 130, changes to the width of fin 130 in double-gate FinFET 300 do not affect the mobility of the majority carriers (i.e., electrons for N-type devices and holes for P-type devices) in fin 130. The mobility of the majority carriers may be determined solely by common crystalline orientation (e.g., orientation <110>) of the two side walls of fin 130 in double-gate FinFET 300.

Π-Gate FinFET

Figure 4B:
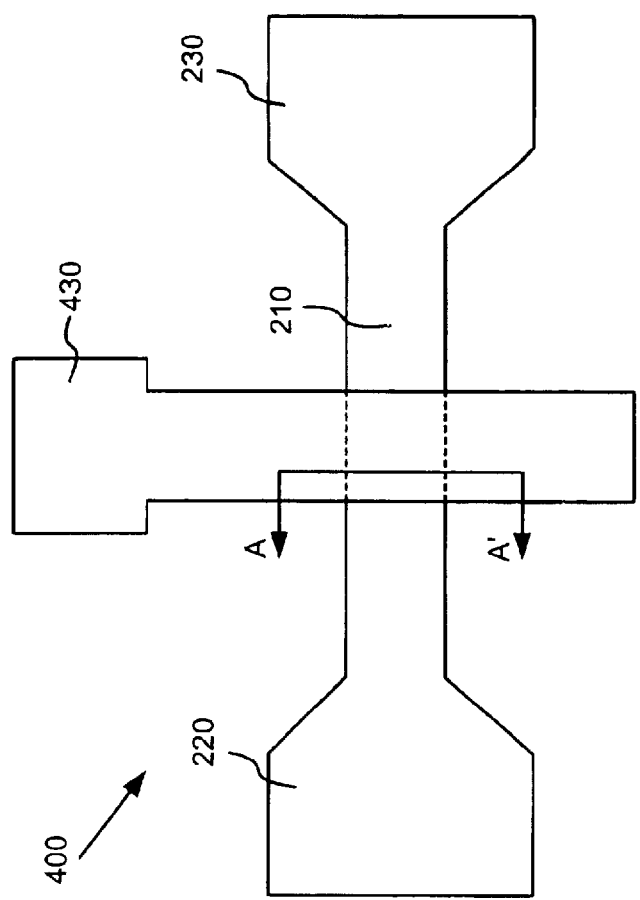
FIGS. 4A and 4B are cross-sectional and top views illustrating the formation of a π-gate FinFET from the device of FIG. 2B in accordance with an exemplary embodiment of the present invention.
Figure 4A:
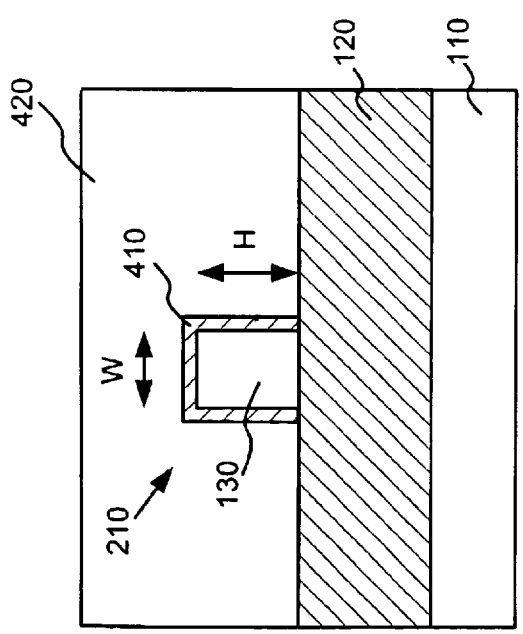

FIG. 4A is a cross-section illustrating the formation of π-gate ("pi-gate") FinFET 400 from structure 210 in FIGS. 2A and 2B in accordance with an implementation consistent with the principles of the invention. Initially, dielectric cap 140 over fin 130 may be removed (e.g., by selective etching), leaving a bare fin 130 on buried oxide layer 120. A relatively thin gate oxide 410 then may be formed on exposed top and side surfaces of fin 130 as illustrated in FIG. 4A. For example, gate oxide 410 may be thermally grown on fin 130. Gate oxide 410 may be grown to a thickness of about 50 Å to about 150 Å on the top and side surfaces of fin 130.

A gate material layer 420 may be deposited over fin structure 210 after formation of gate oxide 410. In an exemplary implementation, gate material layer 420 may include polysilicon deposited using conventional chemical vapor deposition (CVD) or other well known techniques. Alternatively, other semiconducting materials, such as germanium or combinations of silicon and germanium, or various metals may be used as the gate material in layer 420. As discussed, but not shown, above with regard to FIG. 3A, gate material layer 420 may be planarized to facilitate later gate formation, as illustrated in FIG. 4A.

As illustrated in the top view of FIG. 4B, a gate may be patterned and etched in gate material 420 to form gate structure 430 that extends across a channel region of the fin structure 210. The resulting device 400 may be referred to broadly as a "π-gate FinFET."

Gate structure 430 may be defined in gate material layer 420 by lithography (e.g., photolithography). Although not shown in FIGS. 4A and 4B, a bottom antireflective coating (BARC) layer and possibly a top antireflective (TAR) coating (not shown) may be deposited on planarized gate material layer 420 to facilitate etching of gate material layer 420. As explained above, a planarized gate material layer 420 and the BARC layer may facilitate a lower gate CD.

Gate structure 430 may include a gate portion proximate to the sides of the fin structure 210 and a larger electrode portion spaced apart from the fin structure 210. The electrode portion of gate structure 430 may provide an accessible electrical contact for biasing or otherwise controlling the gate portion.

Returning to FIG. 4A (along line A–A' in FIG. 4B), the channels in fin 130 in π-gate FinFET 400 may exist along the two side walls and the top of fin 130 adjacent gate oxide 410. The three channels along the side walls and top of fin 130 give rise to the name "π-gate" in π-gate FinFET 400, because gate material 420 adjacent the two side walls and top of fin 130 constitutes three gates (i.e., in a π-shape) controlling the three channels along the side walls and top of fin 130.

The two side walls of fin 130 in π-gate FinFET 400 may have a common crystalline orientation (e.g., orientation <110>), and the top surface of fin 130 may have a different crystalline orientation (e.g., orientation <100>). Because of these differing crystalline orientations of the channels in fin 130, changes to the width and/or height of fin 130 in π-gate FinFET 400 may affect the mobility of the majority carriers in fin 130, unlike double-gate FinFET 300. In this regard, it may be useful to define a "fin aspect ratio" for fin 130 as H/W, where H is the height of fin 130 and W is the width of fin 130. FIG. 4A illustrates height H and width W for fin 130 in π-gate FinFET 400.

The carrier mobility for the majority carrier may be higher in some crystalline orientations (e.g., orientation <100>) than in other crystalline orientations (e.g., orientation <110>). For fin 130, that has channels along two different crystalline directions, the overall carrier mobility may be an "average" of the carrier mobilities in the side surfaces and top surface of fin 130. It should be noted that the term "average" as used herein should be loosely interpreted to denote some (possibly) weighted combination of the carrier mobilities of the side walls and top surface of fin 130, and not a strict mathematical average. This overall mobility of fin 130 may not be capable of exact mathematical definition due to various physical factors, such as the proximity of the ends of the channel in the top surface of fin 130 with the channels in the side surfaces of fin 130.

The overall carrier mobility of fin 130 may be adjusted, however, by varying the fin aspect ratio H/W (i.e., the ratio of the height H to the width W of fin 130). The overall carrier mobility of fin 130 may increase or decrease with an increase in fin aspect ratio H/W, depending on which of the top surface and the side surfaces of fin 130 has the higher carrier mobility due to its crystalline orientation. Those skilled in the art will be able to determine without undue experimentation, however, based on the disclosure herein, appropriate adjustments to the fin aspect ratio H/W of fin 130 (i.e., in which direction—higher or lower—and by how much) to achieve a desired overall carrier mobility of fin 130 in π-gate FinFET 400. For example, appropriate adjustments to the fin aspect ratio H/W of fin 130 may depend on the particular manufacturing process/materials used, and may be determined without undue experimentation by constructing various test devices and/or by device modeling.

U-Gate FinFET

FIG. 5A is a cross-section illustrating the formation of a u-gate FinFET 500 from structure 210 in FIGS. 2A and 2B in accordance with an implementation consistent with the principles of the invention. Conventional etch chemistry may be used to remove portions of buried oxide layer 120, as illustrated in FIG. 5A. During the etching, a portion of the buried oxide layer 120 below fin 130 may be removed, as illustrated at areas 505 in FIG. 5A. This lateral undercut below fin 130 may be used to facilitate subsequent processing to further etch the buried oxide layer 120 below fin 130.

A second etching may then be performed to laterally etch through the portion of the buried oxide layer 120 below fin 130. In an exemplary implementation, an isotropic etch using, for example, HBr at a high pressure, may be performed to laterally etch through the buried oxide layer 120 located below fin 130, as illustrated in FIG. 5B. Fin 130 is effectively suspended above buried oxide layer 120 in the cross-section illustrated in FIG. 5B. The end portions of fin 130, however, are still attached to the buried oxide layer 120 and the suspended portion of fin 130 illustrated in FIG. 5B is supported by the buried oxide layer 120 at the ends of fin 130 adjacent source/drain regions 220 and 230, respectively.

A gate dielectric layer may then be formed on fin 130. For example, a thin oxide film 510 may be thermally grown on the exposed side surfaces and bottom surface of fin 130 to act as a gate dielectric layer, as illustrated in FIG. 5B. Oxide film 510 may be grown to a thickness of about 10 Å to about 30 Å. Dielectric cap 140, however, protects the top surface of fin 130.

Figures 5C, 5D:
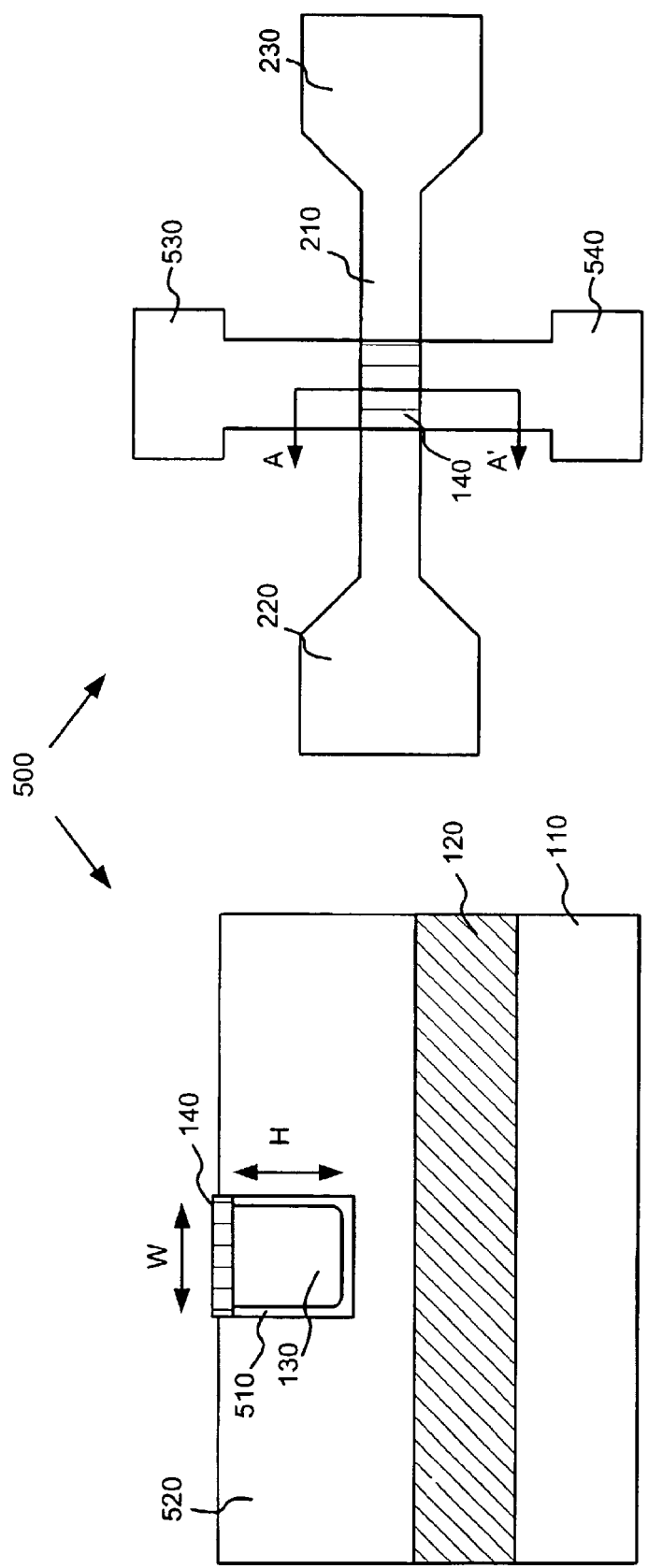

A gate material layer 520 may then be deposited around fin structure 210, as illustrated in FIG. 5C. Gate material layer 520 may comprise the gate material for the subsequently formed gate electrode and may include polysilicon deposited using conventional chemical vapor deposition (CVD) to a thickness ranging from about 500 Å to about 1000 Å. Alternatively, other semiconducting materials, such as germanium or combinations of silicon and germanium, or various metals may be used as the gate material.

Gate material layer 520 may then be planarized. For example, a chemical-mechanical polishing (CMP) may be performed so that the gate material is even with or nearly even with dielectric cap 140 in the vertical direction, as illustrated in FIG. 5C. Referring to FIG. 5C, the cross-section of gate material layer 520 in the channel region of fin 130 is U-shaped and the gate material surrounds fin 130 on the two side surfaces and the bottom surface of fin 130. The top surface of fin 130, however, is covered by dielectric cap 140.

Gate material layer 520 may then be patterned and etched to form the gate electrodes 530 and 540 of u-gate FinFET 500. For example, FIG. 5D illustrates a top view of u-gate FinFET 500 consistent with the present invention after gate electrodes 530 and 540 are formed. As illustrated, u-gate FinFET 500 includes a structure with gate electrodes 530 and 540 and gate material 520 (FIG. 5C) surrounding the sides and the bottom surface of fin 130.

Returning to FIG. 5C (along line A–A' in FIG. 5D), the channels in fin 130 in u-gate FinFET 500 may exist along the two side walls and the bottom of fin 130 adjacent gate oxide 510. The three channels along the side walls and bottom of fin 130 give rise to the name "u-gate" in u-gate FinFET 500, because gate material 520 adjacent the two side walls and bottom of fin 130 constitutes three gates (i.e., in a U-shape) controlling the three channels along the side walls and bottom of fin 130.

The two side walls of fin 130 in u-gate FinFET 500 may have a common crystalline orientation (e.g., orientation <110>), and the bottom surface of fin 130 may have a different crystalline orientation (e.g., orientation <100>). Because of these differing crystalline orientations of the channels in fin 130, changes to the aspect ratio H/W of fin 130 in u-gate FinFET 500 may affect the overall mobility of the carriers in fin 130, similar to π-gate FinFET 400. In practice, the overall mobility of fin 130 in u-gate FinFET 500 based on its aspect ratio H/W may be very related (though not necessarily identical) to that of fin 130 in π-gate FinFET 400 described above. This similarity may be due to the structural similarities between a π-shaped gate and a u-shaped gate, differing in whether the third channel is located on the top or bottom surface of fin 130.

Similar to π-gate FinFET 400, the overall carrier mobility of fin 130 in u-gate FinFET 500 may be adjusted by varying the fin aspect ratio H/W. The overall carrier mobility of fin 130 may increase or decrease with an increase in fin aspect ratio H/W, depending on which of the top surface and the side surfaces of fin 130 has the higher carrier mobility due to its crystalline orientation. Those skilled in the art will be able to determine without undue experimentation, however, based on the disclosure herein, appropriate adjustments to the fin aspect ratio H/W of fin 130 to achieve a desired overall carrier mobility of fin 130 in u-gate FinFET 500.

Round-Gate FinFET

FIG. 6A is a cross-section illustrating the formation of a round-gate FinFET 600 from structure 210 in FIGS. 2A and 2B in accordance with an implementation consistent with the principles of the invention. Conventional etch chemistry may be used to remove portions of buried oxide layer 120, as described above with reference to FIG. 5A. A second etching may then be performed to laterally etch through the portion of the buried oxide layer 120 below fin 130. In an exemplary implementation, an isotropic etch using, for example, HBr at a high pressure, may be performed to laterally etch through the buried oxide layer 120 located below fin 130, as illustrated in FIG. 5B. Fin 130 is effectively suspended above buried oxide layer 120, as described above with respect to FIG. 5B.

Unlike FIG. 5B, when forming round-gate FinFET 600, dielectric cap 140 over fin 130 may be removed (e.g., by selective etching), leaving a bare fin 130 suspended above buried oxide layer 120. A gate dielectric layer may then be formed on fin 130. For example, a thin oxide film 610 may be thermally grown on all exposed surfaces of fin 130 to act as a gate dielectric layer, as illustrated in FIG. 6A. Oxide film 610 may be grown to a thickness of about 10 Å to about 30 Å. Dielectric cap 140, however, protects the top surface of fin 130.

A gate material layer 620 may then be deposited around fin structure 210, as illustrated in FIG. 6A. Gate material layer 620 may comprise the gate material for the subsequently formed gate electrode and may include polysilicon deposited using conventional chemical vapor deposition (CVD) to a thickness ranging from about 500 Å to about 1000 Å. Alternatively, other semiconducting materials, such as germanium or combinations of silicon and germanium, or various metals may be used as the gate material.

Gate material layer 620 may then be patterned and etched to form a gate structure 630 of round-gate FinFET 600. For example, FIG. 6B illustrates a top view of round-gate FinFET 600 consistent with the present invention after gate structure 630 is formed. As illustrated, round-gate FinFET 600 includes a gate structure 630 with gate material layer 620 (FIG. 6A) surrounding all four sides of fin 130.

Returning to FIG. 6A (along line A–A' in FIG. 6B), the channels in fin 130 in round-gate FinFET 600 may exist along the two side walls, the top, and the bottom of fin 130 adjacent gate oxide 610. The four channels along the side walls, the top, and bottom of fin 130 give rise to the name "round-gate" in round-gate FinFET 600, because gate material 620 constitutes four gates "around" fin 130 controlling the four channels along the side, top, and bottom surfaces of fin 130.

The two side walls of fin 130 in round-gate FinFET 600 may have a common crystalline orientation (e.g., orientation <110>), and the top and bottom surfaces of fin 130 may have a different, but common crystalline orientation (e.g., orientation <100>). Because of these differing crystalline orientations of the channels in fin 130, changes to the aspect ratio H/W of fin 130 in round-gate FinFET 600 may affect the overall mobility of the carriers in fin 130, like π-gate FinFET 400 and u-gate FinFET 500. In practice, the overall mobility of fin 130 in round-gate FinFET 600 based on its aspect ratio H/W may behave somewhat differently from π-gate FinFET 400 and u-gate FinFET 500 at least because fin 130 in round-gate FinFET 600 has one more horizontal channel than π-gate FinFET 400 and u-gate FinFET 500. In particular, this additional horizontal channel on the top or bottom surface of fin 130 may weight the "average" overall mobility for round-gate FinFET 600 differently than the overall mobility values for either π-gate FinFET 400 or u-gate FinFET 500.

Similar to π-gate FinFET 400, the overall carrier mobility of fin 130 in round-gate FinFET 600 may be adjusted by varying the fin aspect ratio H/W. The overall carrier mobility of fin 130 may increase or decrease with an increase in fin aspect ratio H/W, depending on which of the top/bottom surfaces and the side surfaces of fin 130 has the higher carrier mobility due to its crystalline orientation. Those skilled in the art will be able to determine without undue experimentation, however, based on the disclosure herein, appropriate adjustments to the fin aspect ratio H/W of fin 130 to achieve a desired overall carrier mobility of fin 130 in round-gate FinFET 600.

Exemplary Implementations with Different Carrier Mobilities

Figure 7:
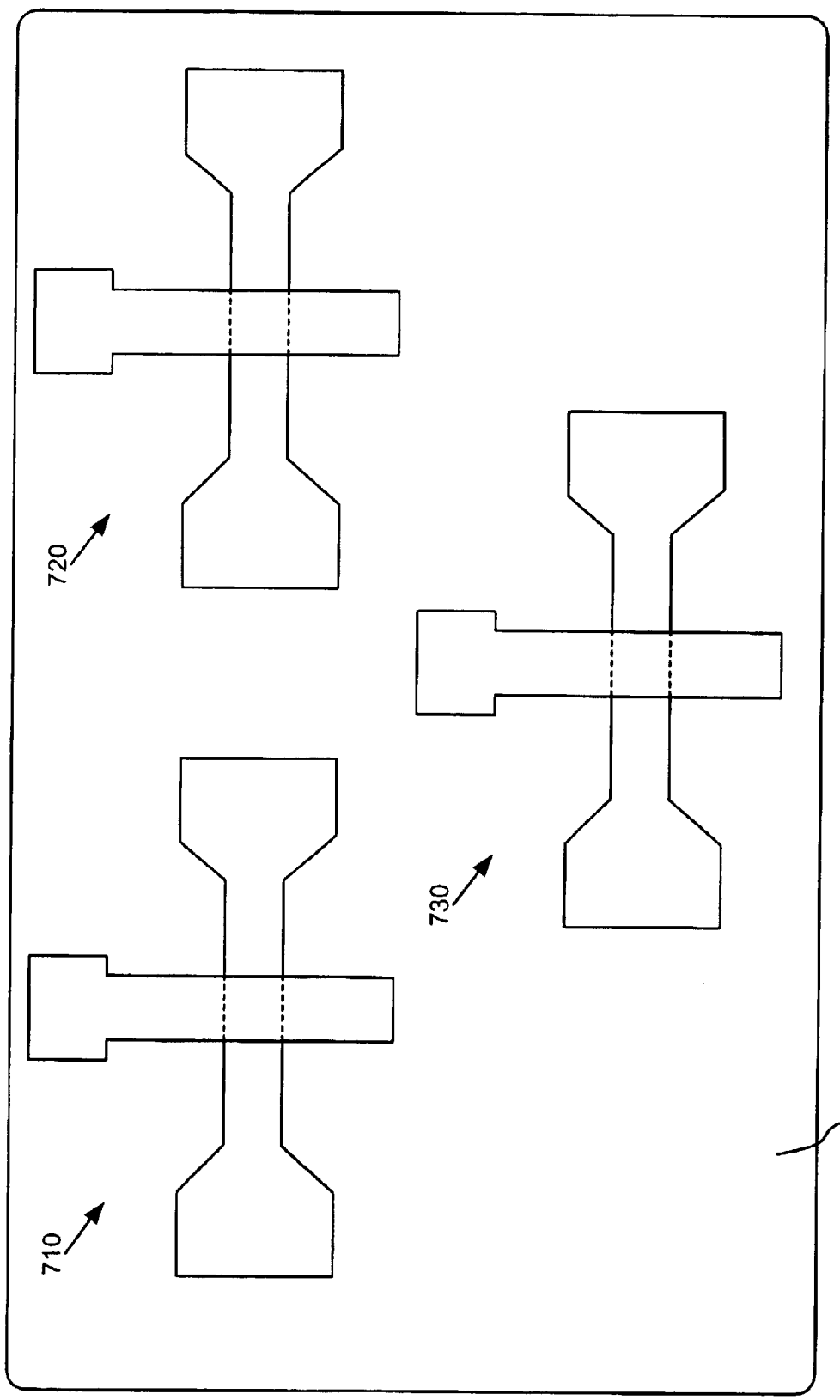
FIG. 7 schematically illustrates a top view of a wafer including any the devices of FIGS. 3A–6B in accordance with an exemplary embodiment of the present invention.

FIG. 7 schematically illustrates a top view of a wafer including FinFET devices 710, 720, and 730 in accordance with an exemplary embodiment of the present invention. Buried oxide layer 120 illustrates the wafer (or chip), on which the three illustrated devices 710, 720, and 730 are formed. At least two of devices 710, 720, and 730 may have a different overall carrier mobilities. Devices 710, 720, and 730 may all be one device type of π-gate FinFET 400, u-gate FinFET 500, and round-gate FinFET 600. Alternately, devices 710, 720, and 730 may include two or more different device types of double-gate FinFET 300, π-gate FinFET 400, u-gate FinFET 500, and round-gate FinFET 600. For example, a double-gate FinFET 300 and one of π-gate FinFET 400, u-gate FinFET 500, and round-gate FinFET 600 may have the same fin aspect ratio H/W, but may nonetheless have different overall carrier mobilities due to the additional horizontally-oriented channel(s) in FinFET 400/500/600.

Further, the group of devices 710, 720, and 730 may all be N-type MOS (NMOS) devices, P-type MOS (PMOS), or some combination of NMOS and PMOS devices (e.g., complementary MOS (CMOS) devices). Although devices 710, 720, and 730 may be connected to other devices, or interconnected, these connections are not illustrated in FIG. 7 for clarity of presentation.

Those skilled in the art will understand, in view of the disclosure herein, that different devices (e.g., devices 710 and 720) may be formed with different overall carrier mobilities (by virtue of different fin aspect ratios H/W) for a variety of design reasons. For example, the overall carrier mobility may be varied based on the type of device 710/720. In one implementation consistent with the principles of the invention, NMOS devices may be formed with an overall carrier mobility, by virtue of a selected fin aspect ratio, that is larger in magnitude (i.e., absolute value) than the overall carrier mobility, by virtue of a differently selected fin aspect ratio, of PMOS devices on the same wafer/chip. Alternately, PMOS devices may be formed with an overall carrier mobility larger in magnitude than the overall carrier mobility of NMOS devices on the same wafer/chip. Alternately, the fin aspect ratios for an NMOS device (e.g., device 710) and a PMOS device (e.g., device 720) may be selected so that the overall carrier mobilities of the devices are approximately equal.

It may also be advantageous to vary fin aspect ratios H/W within a given circuit element (e.g., inverter, NAND gate, memory element, NOR gate, etc.). Within a single circuit element, for example, one FinFET device 710 may have a first fin aspect ratio $H/W_1$. Another FinFET device 720 within the circuit element may have a second fin aspect ratio $H/W_2$, for example to achieve a balance in drive current between devices 710/720. In some implementations consistent with the principles of the invention, the different-aspect fins of devices 710 and 720 in the circuit element may be electrically connected (e.g., by connecting a source/drain region in device 710 with a drain/source region in device 720 in FIG. 7).

Alternately, or additionally, fin aspect ratios H/W may be varied between circuit elements. For example, one circuit element may include one or more FinFET devices, and FinFET device 710 may have a first fin aspect ratio $H/W_1$ and associated first overall carrier mobility. A separate circuit element may include one or more FinFET devices 720 having a second fin aspect ratio $H/W_2$ and associated second overall carrier mobility.

Further, more than one design constraint may be satisfied by varying the fin aspect ratio(s) of devices 710–730 consistent with the principles of the invention disclosed herein. For example, devices 710 and 720 may respectively be NMOS and PMOS components of a CMOS device. Also, some pre-existing design rule may exist, such as (purely by way of example) the PMOS channel width having a 2:1 ratio to the NMOS channel width so that the drive currents of typical, planar MOSFET devices that are arranged in this manner have some pre-existing relationship. Adjusting the fin aspect ratios of devices 710 and 720 may permit a different channel width ratio (e.g., 3:2), while keeping the pre-existing relationship between the drive currents of devices 710 and 720. That is, the respective widths $W_1$ and $W_2$ of devices 710 and 720 may be set to have a 3:2 ratio, and the respective heights $H_1$ and $H_2$ of devices 710 and 720 may be adjusted so that the respective fin aspect ratios $H_1/W_1$ and $H_2/W_2$ produce the pre-existing drive current relationship.

Alternately, adjusting the fin aspect ratios of devices 710 and 720 may permit the same channel width ratio (e.g., 2:1), while creating a new relationship between the drive currents of devices 710 and 720. That is, the respective widths $W_1$ and $W_2$ of devices 710 and 720 may be set in a 2:1 ratio, and the respective heights $H_1$ and $H_2$ of devices 710 and 720 may be adjusted so that the respective fin aspect ratios $H_1/W_1$ and $H_2/W_2$ produce a new drive current relationship (e.g., equal drive currents between devices 710/720).

Those skilled in the art will appreciate that fin widths of different devices 710/720 (e.g., widths $W_1$ and $W_2$) may be selected by adjusting the mask(s) used to pattern, for example, photoresist mask 150 in FIG. 1 that is used to form fin 130 in FIG. 2B. Similarly, fin heights of different devices 710/720 (e.g., heights $H_1$ and $H_2$) may be selected by selectively masking some fins 130 and etching other exposed fins 130 to reduce their heights.

Thus, in accordance with the present invention, different FinFET devices 710/720/730 may be formed with different fin aspect ratios. These different devices 710/720/730 may be formed on the same wafer or chip and may exhibit different the same overall carrier mobility or different overall carrier mobilities. Advantageously, the resulting structure exhibits good short channel behavior. In addition, the present invention provides increased flexibility and can be easily integrated into conventional processing.

Other Implementation

Figure 8B:
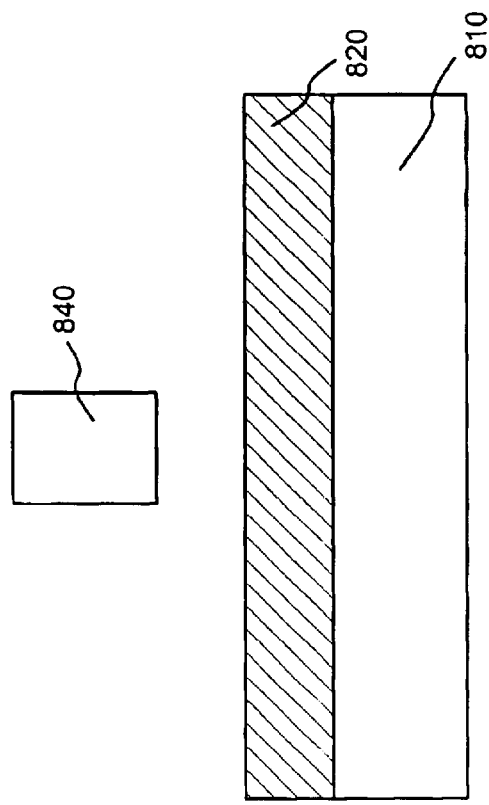
FIGS. 8A to 8C are cross-sections illustrating the formation of a round-gate FinFET in accordance with another implementation of the present invention.
Figure 8A:
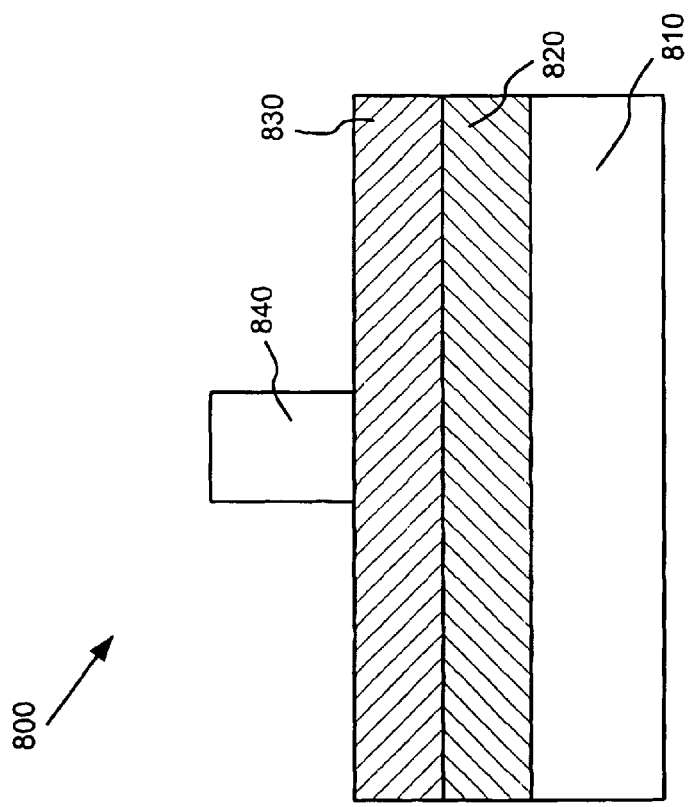
Figure 8C:
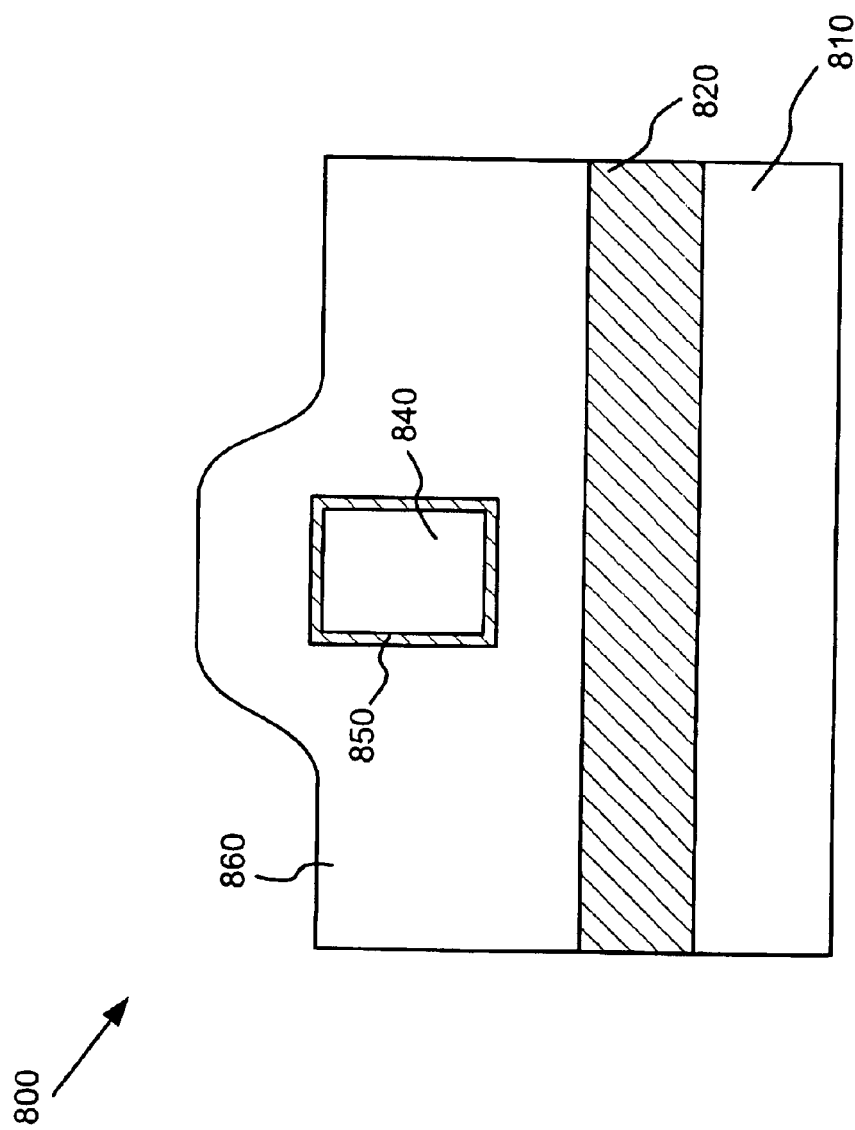

In some implementations, it may be desirable to form a round-gate FinFET other than as described above. FIGS. 8A to 8C are cross-sections illustrating the formation of a round-gate FinFET 800 in accordance with another implementation of the present invention. FIG. 8A is a cross-section illustrating a processing stage after fin formation (similar to FIG. 2B). A silicon fin 840 may be formed on a first dielectric layer 830, a second dielectric layer 820, and a substrate 810. Although not illustrated in FIG. 8A, fin 840 may be connected at either end to source and drain regions (similar to FIG. 2A).

Selective etching may then be performed to remove the portion of first dielectric layer 830 below fin 840, as illustrated in FIG. 8B. Fin 840 is effectively suspended above second dielectric layer 820. The end portions of fin 840, however, are still attached to the remaining first dielectric layer 830, and the suspended portion of fin 840 illustrated in FIG. 8B may be supported by the first dielectric layer 830 at the ends of fin 840 adjacent the source/drain regions (not shown).

A gate dielectric layer may then be formed on fin 840. For example, a thin oxide film 850 may be thermally grown on all exposed surfaces of fin 840 to act as a gate dielectric layer, as illustrated in FIG. 8C. Oxide film 850 may be grown to a thickness of about 10 Å to about 30 Å.

A gate material layer 860 may then be deposited around the fin structure 840, as also illustrated in FIG. 6A. Gate material layer 860 may comprise the gate material for the subsequently formed gate electrode and may include polysilicon deposited using conventional chemical vapor deposition (CVD) to a thickness ranging from about 500 Å to about 1000 Å. Alternatively, other semiconducting materials, such as germanium or combinations of silicon and germanium, or various metals may be used as the gate material. Gate material layer 860 may be subsequently patterned into a gate and gate electrode for round-gate FinFET 800 as described elsewhere herein. In this manner, a round-gate FinFET 800 may be formed by removal of a dielectric layer 830 (or other sacrificial layer) under fin 840.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Further, although the side surfaces of FinFET devices 400/500/600 have been described as having a <110> crystalline orientation and the top/bottom surfaces have been described as having a <100> crystalline orientation, fabrication of these devices using the techniques described in commonly-owned application Ser. No. 10/863392 (Docket No. H1128), entitled "Formation Of Semiconductor Devices To Achieve <100> Channel Orientation" and filed Jun. 9, 2004, may result in side surfaces with a <100> crystalline orientation and top/bottom surfaces with another crystalline orientation, such as <110> or <111>.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A semiconductor device, comprising:
   a substrate;
   an insulating layer formed on the substrate;
   a first device formed on the insulating layer, comprising:
      a first fin formed on the insulating layer and having a first fin aspect ratio,
      a first gate dielectric formed on four surfaces of the first fin, and
      a first gate material formed adjacent the first gate dielectric on the four surfaces of the first fin; and
   a second device formed on the insulating layer, comprising:
      a second fin formed on the insulating layer and having a second fin aspect ratio different from the first fin aspect ratio.

2. The semiconductor device of claim 1, wherein the first device is an NMOS device and the second device is a PMOS device.

3. The semiconductor device of claim 1, wherein the first device and the second device are included in a single circuit element.

4. The semiconductor device of claim 1, wherein a first carrier mobility in the first fin of the first device is different from a second carrier mobility in the second fin of the second device.

5. The semiconductor device of claim 1, wherein the second device further includes:
   a second gate dielectric formed on at least three surfaces of the second fin, and
   a second gate material formed on the at least three surfaces of the second fin.

6. The semiconductor device of claim 5, wherein the second gate dielectric and the second gate material are formed on four surfaces of the second fin.

7. The semiconductor device of claim 1, where the first and second fin aspect ratios are configured to produce a produce first and second carrier mobilities for the first and second fins, respectively, and wherein the first and second carrier mobilities are different.

8. A semiconductor device, comprising:
   an insulating layer;
   a first device formed on the insulating layer, comprising:
      a first fin formed on the insulating layer and having a first height and a first width,
      a first dielectric layer formed on at least three sides of the first fin, and
      a first gate adjacent the first dielectric layer; and
   a second device formed on the insulating layer, comprising:
      a second fin formed on the insulating layer and having a second height and a second width,
      a second dielectric layer formed on at least three sides of the second fin, and
      a second gate adjacent the second dielectric layer,
   wherein a first ratio of the first height and first width is different from a second ratio of the second height and second width, and
   wherein the first ratio is selected to produce a first carrier mobility with respect to the first fin and the second ratio is selected to produce a second carrier mobility with respect to the second fin.

9. The semiconductor device of claim 8, wherein the first device is an NMOS device and the second device is a PMOS device.

10. The semiconductor device of claim 8, wherein the first device and the second device are included in a single circuit element.

11. The semiconductor device of claim 8, wherein a first carrier mobility in the first fin of the first device is about equal to a second carrier mobility in the second fin of the second device.

12. The semiconductor device of claim 8, wherein the first device is a π-gate FinFET, a u-gate FinFET, or a round-gate FinFET.

13. The semiconductor device of claim 12, wherein the second device is a π-gate FinFET, a u-gate FinFET, or a round-gate FinFET.

14. The semiconductor device of claim 8, further comprising:
   a third device formed on the insulating layer, comprising:
      a third fin formed on the insulating layer and having a third height and a third width,
      a third dielectric layer formed on at least three sides of the third fin, and
      a third gate adjacent the third dielectric layer,
   wherein a third ratio of the third height and third width is different from the first ratio and the second ratio, and
   wherein the third ratio is selected to produce a third carrier mobility with respect to the third fin and the third carrier mobility is different from at least one of the first or second carrier mobilities.

15. The semiconductor device of claim 8, wherein the first carrier mobility is different from the seond carrier mobility.

16. The semiconductor device of claim 8, wherein each of the first and second heights ranges from about 300 Å to about 1500 Å.

17. A semiconductor device, comprising:
   an insulating layer;
   an N-type device formed on the insulating layer, comprising:
      a first fin formed on the insulating layer and having a first height and a first width; and
   a P-type device formed on the insulating layer, comprising:
      a second fin formed on the insulating layer and having a second height and a second width,
   wherein the second width is a predetermined multiple of the first width, and
   wherein the first height and the second height are configured so that a carrier mobility of the N-type device approximately equals a carrier mobility of the P-type device.

18. The semiconductor device of claim 17, wherein the predetermined multiple is about 2.

19. The semiconductor device of claim 17, wherein the predetermined multiple is about 1.5.

20. The semiconductor device of claim 17, wherein both the N-type device and the P-type device are π-gate FinFETs, u-gate FinFETs, or round-gate FinFETs.

* * * * *